United States Patent
Zhu (10) Patent No.: US 8,512,470 B2
(45) Date of Patent: Aug. 20, 2013

(54) SYSTEM AND METHODS FOR GROWING HIGH-RESISTANCE SINGLE CRYSTALS

(75) Inventor: Meng Zhu, Oakland, CA (US)

(73) Assignee: China Crystal Technologies Co. Ltd, Beijing (CN)

( * ) Notice: Subject to any disclaimer, the term of this patent is extended or adjusted under 35 U.S.C. 154(b) by 280 days.

(21) Appl. No.: 13/082,718

(22) Filed: Apr. 8, 2011

(65) Prior Publication Data

US 2012/0255484 A1    Oct. 11, 2012

(51) Int. Cl.
*C30B 11/04* (2006.01)

(52) U.S. Cl.
USPC ............ 117/78; 117/11; 117/73; 117/74; 117/76; 117/77; 117/80; 117/81; 117/83; 117/200; 117/204; 117/206; 117/223

(58) Field of Classification Search
USPC ............ 117/11, 73–74, 76–78, 80–81, 83, 117/200, 204, 206, 223, 931, 936, 954–958
See application file for complete search history.

(56) References Cited

U.S. PATENT DOCUMENTS

| | | | |
|---|---|---|---|
| 3,243,267 A * | 3/1966 | Piper | 117/109 |
| H147 H | 11/1986 | Feldman | |
| 4,632,710 A | 12/1986 | Rees | |
| 5,830,269 A * | 11/1998 | Kawase et al. | 117/83 |
| 6,007,622 A * | 12/1999 | Kawase et al. | 117/82 |
| 6,572,700 B2 * | 6/2003 | Kawase et al. | 117/206 |

* cited by examiner

*Primary Examiner* — Michael Kornakov
*Assistant Examiner* — Kenneth A. Bratland, Jr.
(74) *Attorney, Agent, or Firm* — SV Patent Service (57) ABSTRACT

A method for growing high-resistivity single crystals includes placing a raw material in a vacuum-sealable ampoule, heating the raw material in the vacuum-sealable ampoule to vaporize the moisture in the raw material, exhausting the vaporized moisture from the vacuum-sealable ampoule, vacuum-sealing the vacuum-sealable ampoule, heating the raw material in the vacuum-sealable ampoule to vaporize the oxide compounds in the raw material, cooling a bulb in a cap on the vacuum-sealable ampoule to produce condensed oxide compounds on an inner surface of the bulb, removing the bulb and the condensed oxide compounds from the vacuum-sealable ampoule, wherein the raw material in the vacuum-sealable ampoule comprises carbon as an impurity, and placing the vacuum-sealable ampoule comprising the raw material in a crystal growth apparatus to grow a high-resistivity crystal from the raw material.

19 Claims, 12 Drawing Sheets

Figure 6C

SYSTEM AND METHODS FOR GROWING HIGH-RESISTANCE SINGLE CRYSTALS

BACKGROUND OF THE INVENTION

The present invention relates to technologies for growing single crystals, and in particular, to technologies for growing single crystals with desirable properties.

The fabrication of electronic devices often involve the formation of integrated circuitry on large and uniform single semiconductor crystals followed by slicing and polishing to form individual device chips. For example, power amplifiers in wireless devices such as mobile phones are first formed in a batch on a large GaAs substrate and then cut into separate dies for different wireless devices.

Figure 1:
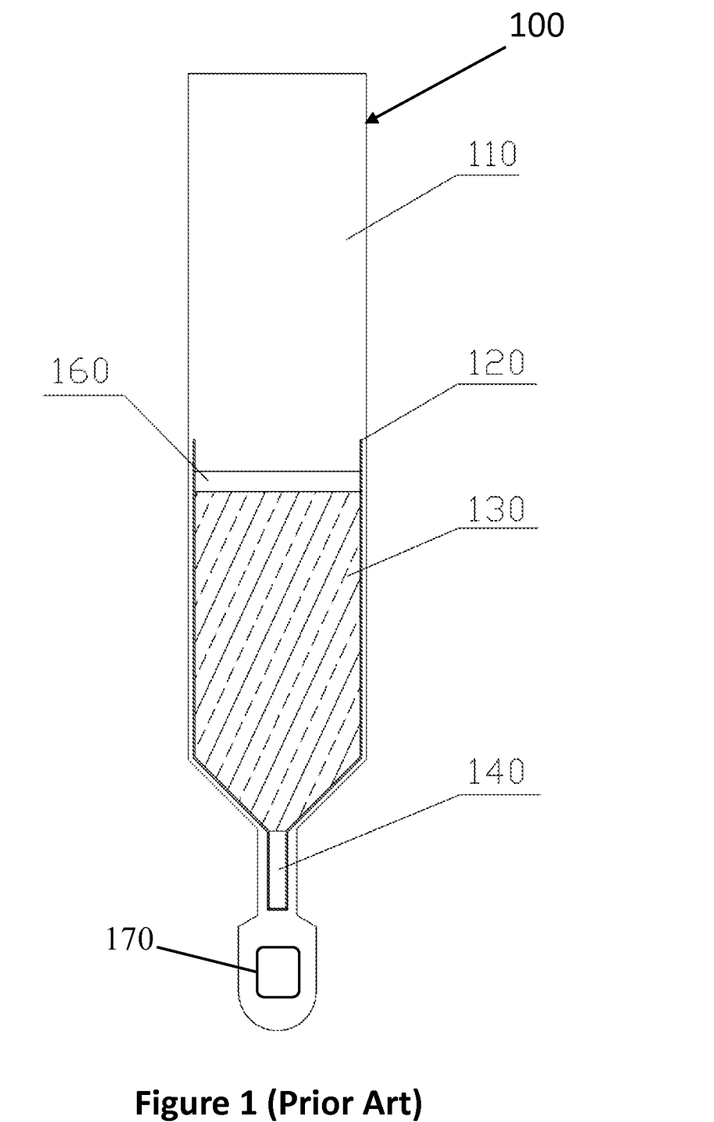
FIG. 1 is a schematic diagram for a conventional crystal growth apparatus.

Typical industrial methods for growing GaAs crystals include pulling method, horizontal boat method, horizontal gradient freeze method, vertical boat method, and vertical gradient freeze method. In a crystal growth process, a raw material (e.g. a polycrystalline GaAs material) is first heated by a heater (not shown) to above its melting point. The melt is brought into contact with a seed crystal (e.g. made of GaAs), allowing the melt to crystallize from the seed crystal. An exemplified commercial crystal growth apparatus 100, shown in FIG. 1, includes an ampoule 110 that provides vacuum for crystal growth, a crucible 120 that holds the raw material 130, and heaters (not shown) around the ampoule 110 configured to melt the raw material in the crucible 120 to form a material melt 160. The crucible 120 has a seed well 140 that holds a seed crystal to start the crystal growth. A dopant source 170 can be placed in the ampoule 110 to dope substance in the crystal during its growth.

Many communication devices require integrated circuitry to be constructed on semiconductor substrates with high intrinsic resistivity in order to suppress noises in wireless communications. Traditionally, high resistivity group III-V compounds can be made by helium bombardment of low-resistivity GaAs single-crystal substrate, or doping during the growth of the crystals.

Despite the progresses made in industrial processes of growing signal crystals, there continues to be a need to simplify the manufacturing process and reduce costs, especially for growing high quality high-resistance single crystals.

SUMMARY OF THE INVENTION

The presently application discloses improved methods for growing high-resistance single crystals. The raw materials for growing the single crystal are selectively purified, which can beneficially produce high resistivity in the single crystal product. The presently disclosed crystal growth apparatus and methods are applicable to crystal growths of a range of materials such as Group III-V, Group II-VI, and Group IV materials.

Electronic devices often require high purity in the single crystal substrate to ensure low losses, fast response, and high signal-to-noise ratios. On the other hand, for some applications, the single crystals are also required to have high resistivity, which is commonly achieved by doping "impurities" in the crystal. An advantageous feature of the presently disclosed methods and systems is that high resistivity can be achieved in single crystals without intentionally doping crystal material with impurities.

In a general aspect, the present invention relates to a method of growing high-resistivity single crystals. The method includes placing a raw material in a vacuum-sealable ampoule, wherein the raw material comprises polycrystalline Group III-V material, Group II-VI material, or Group IV material, wherein the raw material comprises moisture and minute amount of impurities that include oxide compounds and carbon; capping an open end of the vacuum-sealable ampoule while leaving an air channel between the cap and the rim of the open end of the vacuum-sealable ampoule, wherein the cap includes a bulb connected to the opening of the cap with a neck; heating the raw material in the vacuum-sealable ampoule to vaporize the moisture in the raw material; exhausting the vaporized moisture from the vacuum-sealable ampoule; fusing the cap to the rim of the open end of the vacuum-sealable ampoule to vacuum seal the vacuum-sealable ampoule; heating the raw material in the vacuum-sealable ampoule to vaporize the oxide compounds in the raw material; cooling at least a portion of the bulb to below the vaporization temperature of the oxide compounds to produce condensed oxide compounds on an inner surface of the bulb; fusing the neck of the bulb to isolate the condensed oxide compounds from the vacuum-sealable ampoule; breaking the neck to remove the bulb and the condensed oxide compounds from the vacuum-sealable ampoule, wherein the raw material in the vacuum-sealable ampoule comprises carbon as an impurity; and placing the vacuum-sealable ampoule comprising the raw material in a crystal growth apparatus to grow a high-resistivity crystal from the raw material.

Implementations of the system may include one or more of the following. The raw material can be placed in a crucible positioned in the vacuum-sealable ampoule. The vacuum-sealable ampoule can be formed by quartz or glass. The impurities can include at least one of silicon, carbon, or germanium. The high-resistivity crystal can have an electric resistivity above $10^7$ $\Omega$-cm at room temperature. The impurities can include arsenide or arsenic compounds. The method can further include after the step of fusing, heating the raw material in the vacuum-sealable ampoule to vaporize the arsenide and arsenic compounds in the raw material; and cooling a portion of the vacuum-sealable ampoule to produce condensed arsenide and arsenic compounds on an inner surface of the portion of the vacuum-sealable ampoule to remove the arsenide and arsenic from the raw material. The arsenide or the arsenic compounds in the impurities can be selected from the group consisting of AlAs, InAs, YAs, $B_{12}As_2$, $Ca_3As_2$, and $Zn_3As_2$. The polycrystalline material can include GaAs, AlAs, GaN, CdTe, InAs, GaSb, Si, or Ge. A seed crystal can be placed in contact with the raw material in the vacuum-sealable ampoule. The method can further include heating the raw material comprising carbon as an impurity to form a melt in contact with a seed crystal in the crystal growth apparatus; and growing the high-resistivity crystal from the melt.

In another general aspect, the present invention relates to a method of growing high-resistivity single crystals. The method includes placing a raw material in a vacuum-sealable ampoule, wherein the raw material comprises polycrystalline Group III-V material, Group II-VI material, or Group IV material, wherein the raw material comprises moisture and minute amount of impurities that include oxide compounds and carbon; heating the raw material in the vacuum-sealable ampoule to a first temperature to vaporize the moisture in the raw material; removing the vaporized moisture from the vacuum-sealable ampoule; heating the raw material in the vacuum-sealable ampoule to a second temperature to vaporize the oxide compounds in the raw material, wherein the second temperature is higher than the first temperature; removing the condensed oxide compounds from the vacuum-sealable ampoule; and heating the raw material comprising carbon as an impurity to form a melt; and growing a high-resistivity crystal from the melt, wherein the high-resistivity crystal has an electric resistivity above $10^7$ Ω-cm at room temperature.

Implementations of the system may include one or more of the following. The first temperature can be above 100° C., and wherein the second temperature is above 120° C. The steps of heating the raw material can include carbon as an impurity to form a melt and growing a high-resistivity crystal from the melt are performed in a crystal growth apparatus.

In another general aspect, the present invention relates to a method of growing high-resistivity single crystals. The method includes placing a raw material in a vacuum-sealable ampoule through an open end of the vacuum-sealable ampoule, wherein the raw material comprises polycrystalline GaAs, moisture, and minute amount of impurities, wherein the impurities comprise arsenide or arsenic compounds and carbon; heating the raw material in the vacuum-sealable ampoule to vaporize the moisture in the raw material; exhausting the vaporized moisture from the vacuum-sealable ampoule; sealing the vacuum-sealable ampoule; heating the raw material in the vacuum-sealable ampoule to vaporize the arsenide and arsenic compounds in the raw material; cooling a portion of the vacuum-sealable ampoule to produce condensed arsenide and arsenic compounds on an inner surface of the portion of the vacuum-sealable ampoule; and placing the vacuum-sealable ampoule comprising the raw material comprising carbon as an impurity in a crystal growth apparatus, wherein a high-resistivity GaAs crystal is grown.

Implementations of the system may include one or more of the following. The impurities can include oxide compounds, wherein the step of heating the raw material in the vacuum-sealable ampoule to vaporize the arsenide and arsenic compounds in the raw material vaporizes the oxide compounds in the raw material, wherein the method further comprising: after the step of cooling a portion of the vacuum-sealable ampoule, lowering the temperature of the raw material in the vacuum-sealable ampoule to below the vaporization temperature of the arsenide and arsenic compounds but above the vaporization temperature of the oxide compounds; cooling a surface in connection with the vacuum-sealable ampoule to below the vaporization temperature of the oxide compounds to produce condensed oxide compounds on the surface; and removing the condensed oxide compounds from the vacuum-sealable ampoule. The raw material can be placed in a crucible positioned in the vacuum-sealable ampoule, wherein the condensed arsenide or arsenic compounds are formed outside of the crucible, wherein the high-resistivity crystal is grown in the crucible. The vacuum-sealable ampoule can be formed by quartz or glass. The method can further include capping the open end of the vacuum-sealable ampoule after the step of exhausting the vaporized moisture, wherein the step of sealing comprises fusing the cap to the rim of the open end of the vacuum-sealable ampoule to vacuum seal the vacuum-sealable ampoule. The impurities comprise oxide compounds, wherein the step of heating the raw material in the vacuum-sealable ampoule to vaporize the arsenide and arsenic compounds in the raw material vaporizes the oxide compounds in the raw material, wherein the cap includes a bulb connected to the opening of the cap with a neck, the method further comprising: after the step of sealing the vacuum-sealable amp, lowering the temperature of the raw material in the vacuum-sealable ampoule to below the vaporization temperature of the arsenide and arsenic compounds but above the vaporization temperature of the oxide compounds; cooling at least a portion of the bulb in the cap to below the vaporization temperature of the oxide compounds to produce condensed oxide compounds on an inner surface of the bulb; fusing the neck of the bulb to isolate the condensed oxide compounds from the vacuum-sealable ampoule; and breaking the neck of the bulb to separate the bulb and the condensed oxide compounds from the vacuum-sealable ampoule. The high-resistivity GaAs crystal can have an electric resistivity above $10^8$ Ω-cm at room temperature. The method can further include heating the raw material to form a melt in the crystal growth apparatus; and growing the high-resistivity GaAs crystal from the melt.

BRIEF DESCRIPTION OF THE DRAWINGS

The following drawings, which are incorporated in and from a part of the specification, illustrate embodiments of the present specification and, together with the description, serve to explain the principles of the specification.

DETAILED DESCRIPTION

Figure 2:
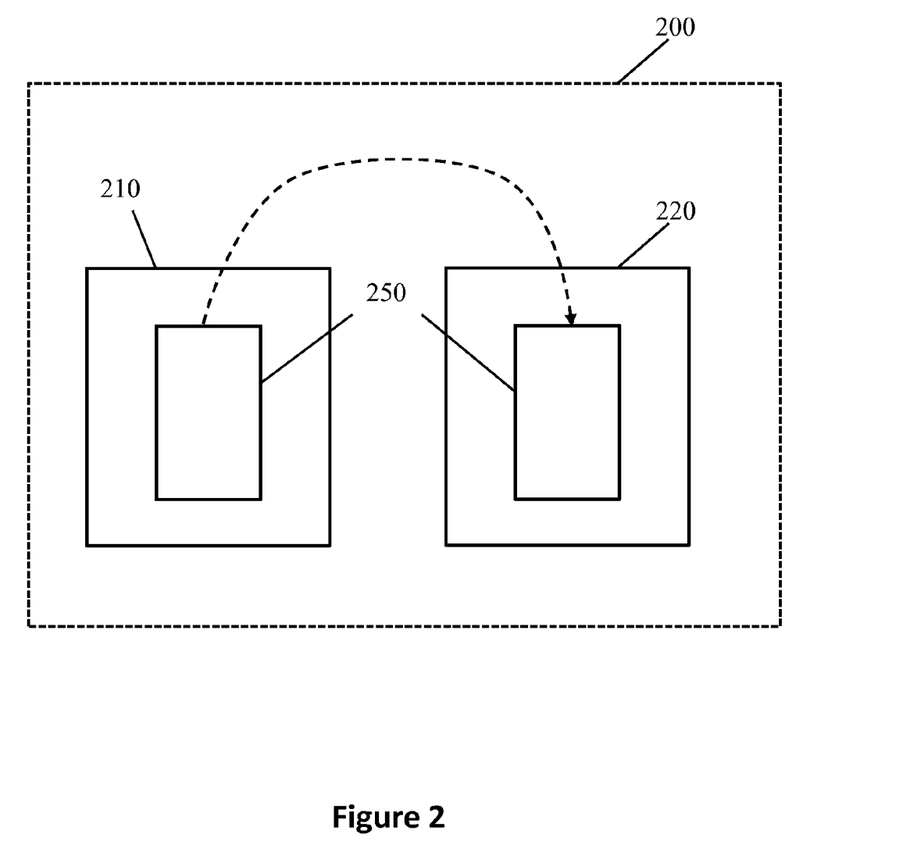
FIG. 2 is a block diagram of a crystal growth system for growing high-resistance single crystals in accordance with the present invention.

Referring to FIG. 2, a crystal growth system 200 for growing high-resistance single crystals includes a material-preparation apparatus 210 and a crystal growth apparatus 220. A vacuum sealable ampoule 250, as described in more detail below, is configured to contain a crucible which in turn holds a raw material for crystal growth. The raw material in the vacuum sealable ampoule 250 is selectively purified by the material-preparation apparatus 210. Afterwards, the vacuum sealable ampoule 250 is transferred to the crystal growth apparatus 220. The raw material is melted and the crystal is grown in the crucible.

Figure 3:
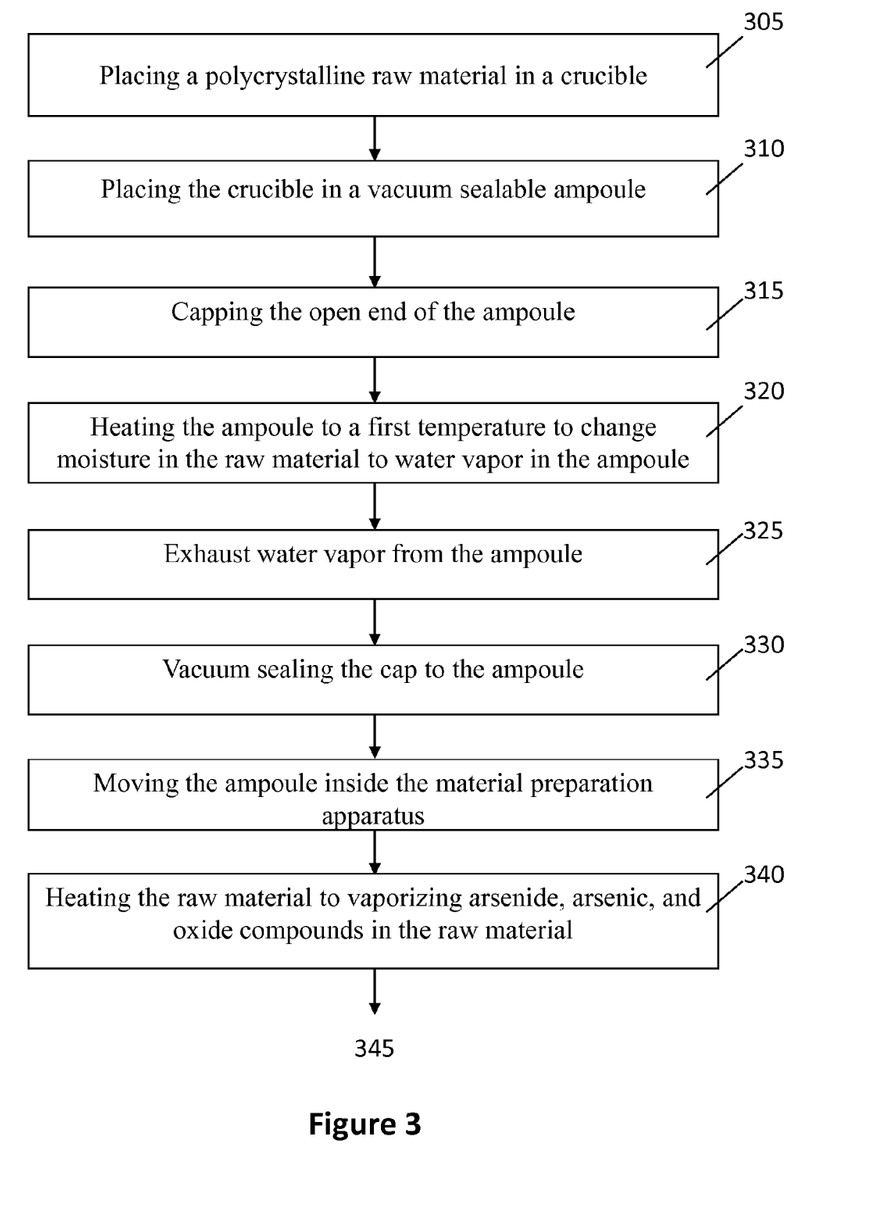
FIG. 3 shows an exemplified flowchart for growing high-resistance single crystals in accordance with the present invention.
Figure 4A:
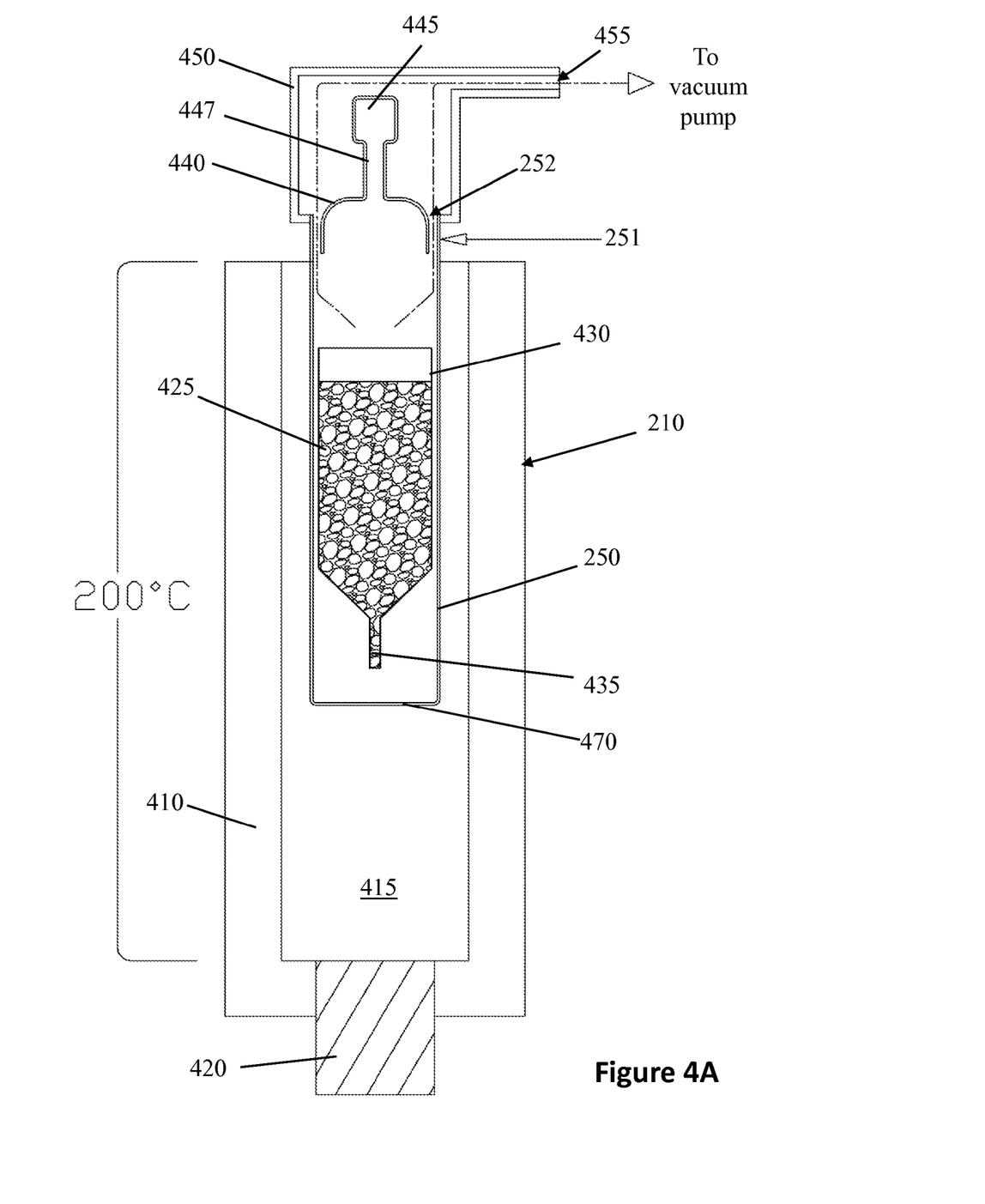
FIGS. 4A-4D are cross-sectional views of a material-preparation apparatus at different steps of a process for preparing raw material to be used for growing high-resistance single crystals in accordance with the present invention.

Referring to FIGS. 3 and 4A, the material-preparation apparatus 210 includes a heating chamber 410 which defines a cavity 415 configured to receive the vacuum sealable ampoule 250. The vacuum sealable ampoule 250 has an upper rim 251 and can be made of quartz. The material-preparation apparatus 210 includes a lower heater 420 at the bottom of the heating chamber 410. The lower heater 420 can be moved upward into the cavity 415 to come into contact with a bottom surface 470 of the vacuum sealable ampoule 250 (shown in FIG. 4B). A raw material 425 for crystal growth is placed in a crucible 430 through an opening on the top of the crucible 430 (step 305, FIG. 3). The raw material is typically in a polycrystalline phase of the same material for the single crystal to be formed. For example, the raw material can be a polycrystalline GaAs material for forming GaAs single crystals. The crucible 430 can be made of pyrolytic boron nitride (pBN). The crucible 430 has a narrow portion in the bottom where a seed crystal 435 is placed in contact with the raw material 425. The crucible 430 containing the raw material 425 and the seed crystal 435 is placed in the vacuum sealable ampoule 250 (step 310, FIG. 3). The vacuum sealable ampoule 250 is capped by a cap 440 (step 315, FIG. 3). Initially, the cap 440 does not seal vacuum sealable ampoule 250. A gap separates the cap 440 from the upper rim 251 which defines an air channel 252. The cap 440 can be made of glass or quartz. The cap 440 includes a neck 447 and a bulb 445 connected to the neck 447.

The vacuum sealable ampoule 250 is inserted into the cavity 415 while leaving the rim 251 above the heating chamber 410. The outer surface of the rim 251 of the vacuum sealable ampoule 250 is sealed by a sealing device 450 that includes an outlet 455. The heating chamber 410 is heated by a heater (not shown) to above 100° C., such as about 200° C. to vaporize the moisture in the raw material 425 (step 320, FIG. 3). The water vapor from the raw material 425 is exhausted out of the vacuum sealable ampoule 250 through the outlet 455 by a vacuum pump (step 325, FIG. 3).

Raw materials for crystal growth commonly include impurities such as arsenide compounds (other than GaAs) such as AlAs, InAs, YAs, $B_{12}As_2$, $Ca_3As_2$, $Zn_3As_2$, etc. The impurities can also include oxide compounds, carbon, silicon, germanium, etc. Electronic devices often require high purity to ensure low losses, fast response, and high signal-to-noise ratios. For this reason, impurities are to be removed from the raw material materials before they are melted and recrystallized. On the other hand, for some applications, the single crystals are also required to have high resistivity, which is commonly achieved by doping "impurities" in the simple crystals.

An advantageous feature of the presently disclosed methods and systems is to remove the need for doping to achieve high resistivity. Undesirable impurities are selectively removed whereas certain impurities are not removed but are used to beneficially increase resistivity in the crystal product. In other words, certain impurities are intentionally kept in the raw material to provide desired property to the crystal product.

Figure 4B:
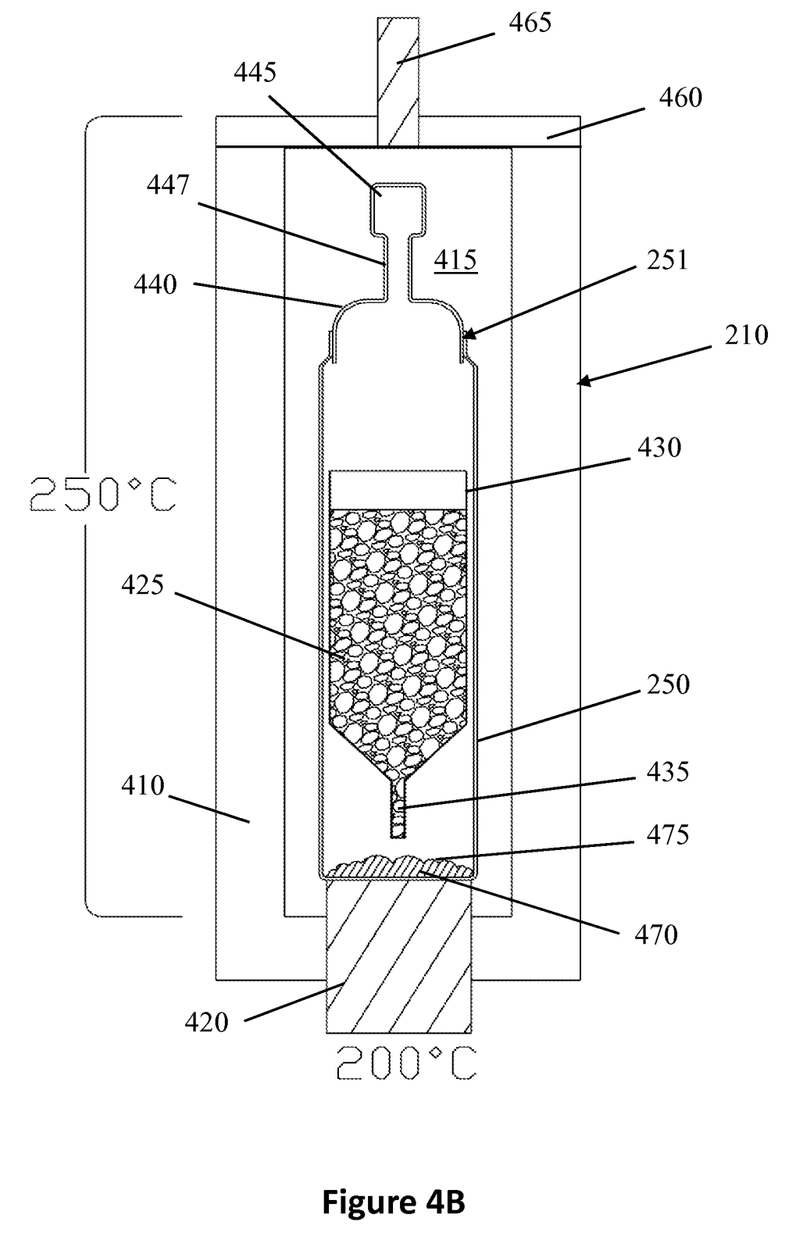
Figure 4C:
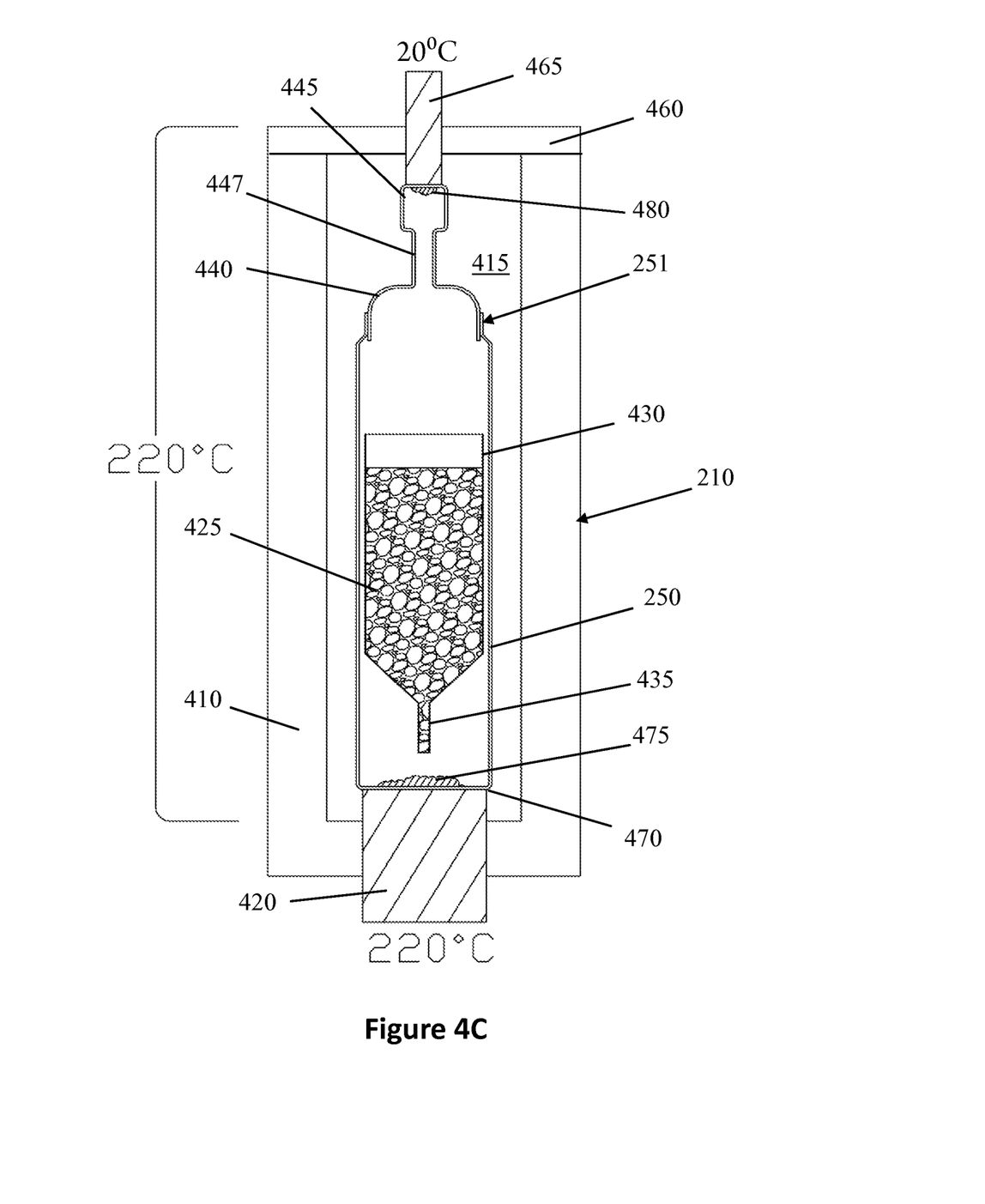

After the water vapor is exhausted from the raw material 425, as shown in FIG. 4B, the cap 440 is heated by a flame and fused to the upper rim 251 of the vacuum sealable ampoule 250, which vacuum seals the crucible 430 and the raw material 425 in the vacuum sealable ampoule 250 (step 330, FIG. 3). The vacuum sealable ampoule 250 is moved down inside the heating chamber 410 (step 335, FIG. 3). The heating chamber 410 is capped by a cover 460 mounted with a moveable upper temperature control device 465.

The heating chamber 410 is next heated to about 250° C. to vaporizing arsenide or arsenic compounds as well as oxide compounds in the raw material 425 (step 340, FIG. 3). The lower heater 420 is raised to contact the bottom of the vacuum sealable ampoule 250. The lower heater 420, and thus the bottom of the vacuum sealable ampoule 250, is kept at about 200° C., which is lower than the condensation temperature for arsenide and arsenic compounds. Thus, the vaporized arsenide and arsenic compounds condense at the bottom surface 470 of the vacuum sealable ampoule 250 to form condensed arsenide and arsenic compounds 475 (step 345, FIG. 3).

The vacuum sealable ampoule 250 is then cooled by reducing heating to the heating camber 410 to a temperature above 120° C., such as about 220° C. (step 350, FIG. 3). At this temperature, the vaporizations of arsenide and arsenic compounds are stopped while the oxide compounds remain in a vaporized state. The upper temperature control device 465 is lowered to come into contact with the bulb 445. The upper temperature control device 465 keeps the top surface of the bulb 445 at about 20° C., on which condensed oxide compounds 480 are formed (step 355, FIG. 3).

Figure 4D:
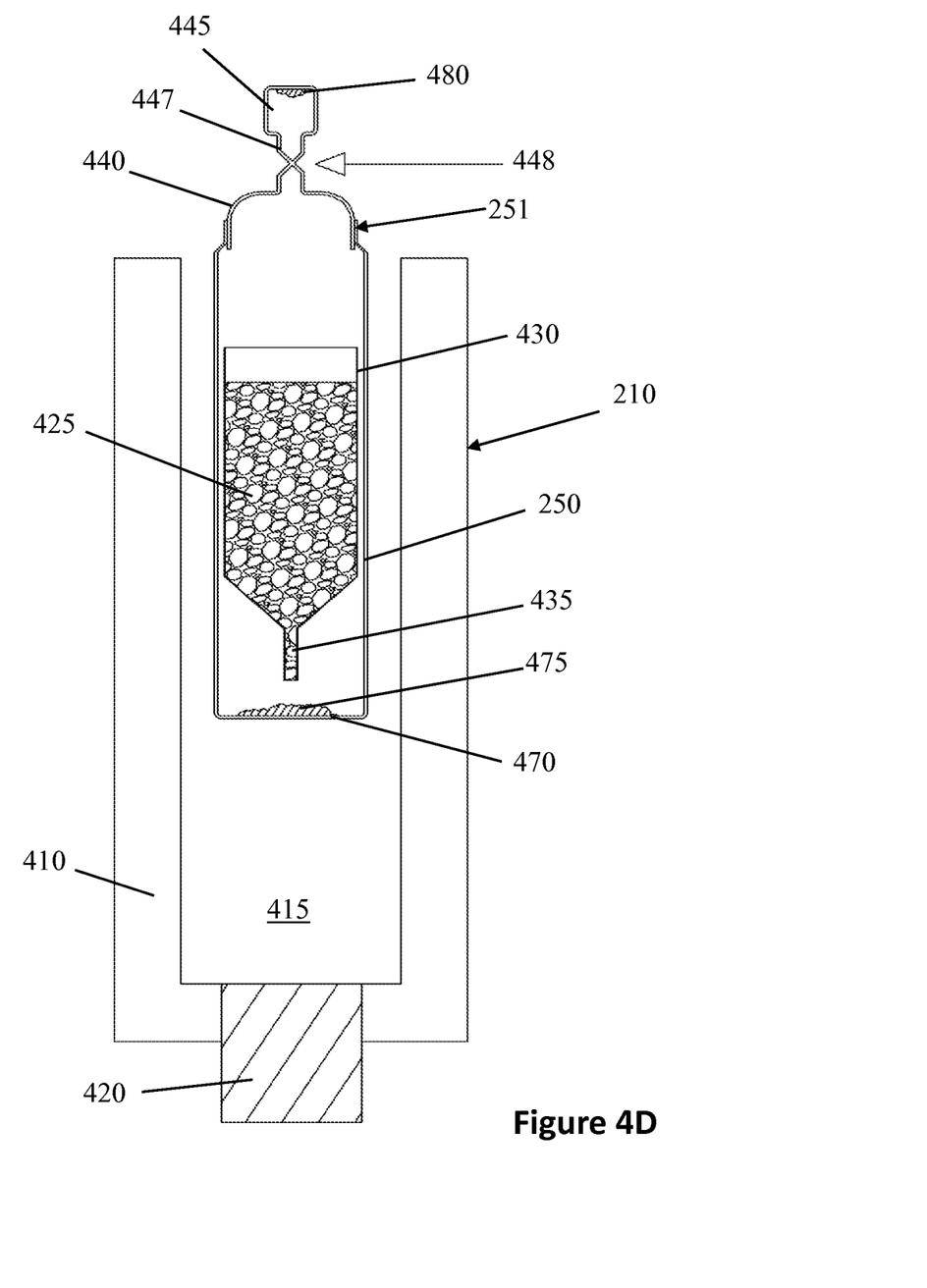

Next, the cover 460 and the upper temperature control device 465 are removed from the heating chamber 410 in the material-preparation apparatus 210. The vacuum sealable ampoule 250 is lifted position the bulb 445 and the neck 447 above the heating chamber 410, as shown in FIG. 4D. The neck 447 is then melted by a flame to form a pinch point 448 which seals the bulb 445 off the rest of from the crucible 430 and the vacuum sealable ampoule 250 (step 360, FIG. 3).

Figure 5:
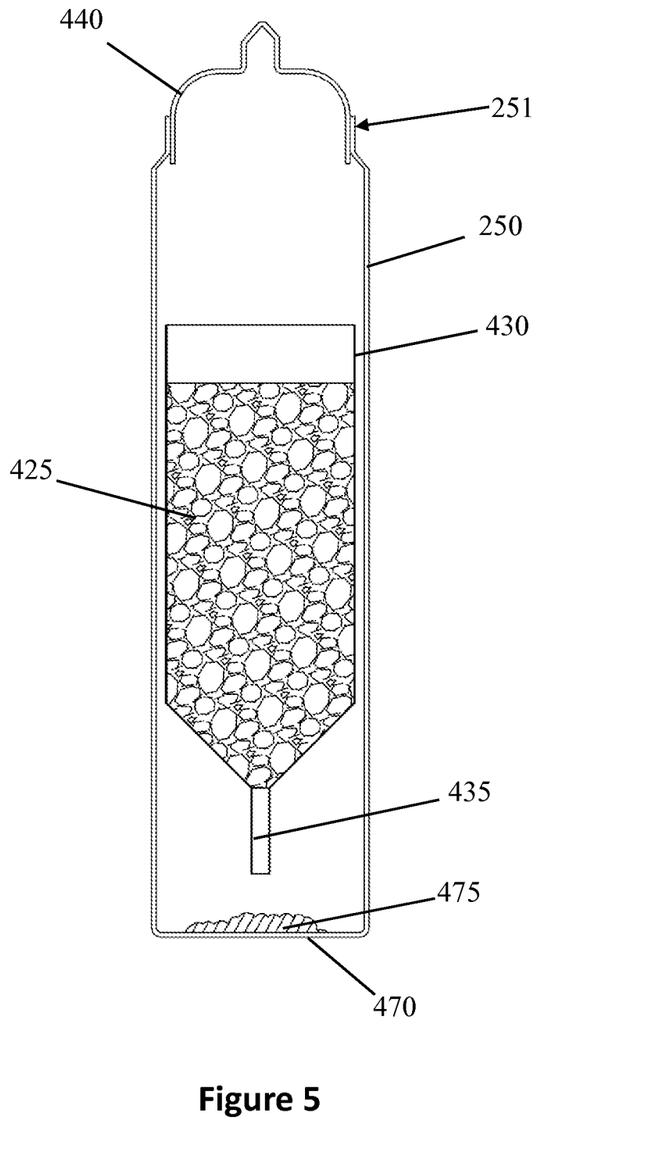
FIG. 5 shows the ampoule containing the crucible holding the raw material prepared by the material-preparation apparatus.

The vacuum sealable ampoule 250 is then removed from the heating chamber 410. The pinch point 448 is then broken by force to separate the bulb 447 from the vacuum sealable ampoule 250 (step 365, FIG. 3) as shown in FIG. 5, removing the condensed oxide compounds 480 from the vacuum sealable ampoule 250 (and the raw material 425).

Figure 6A:
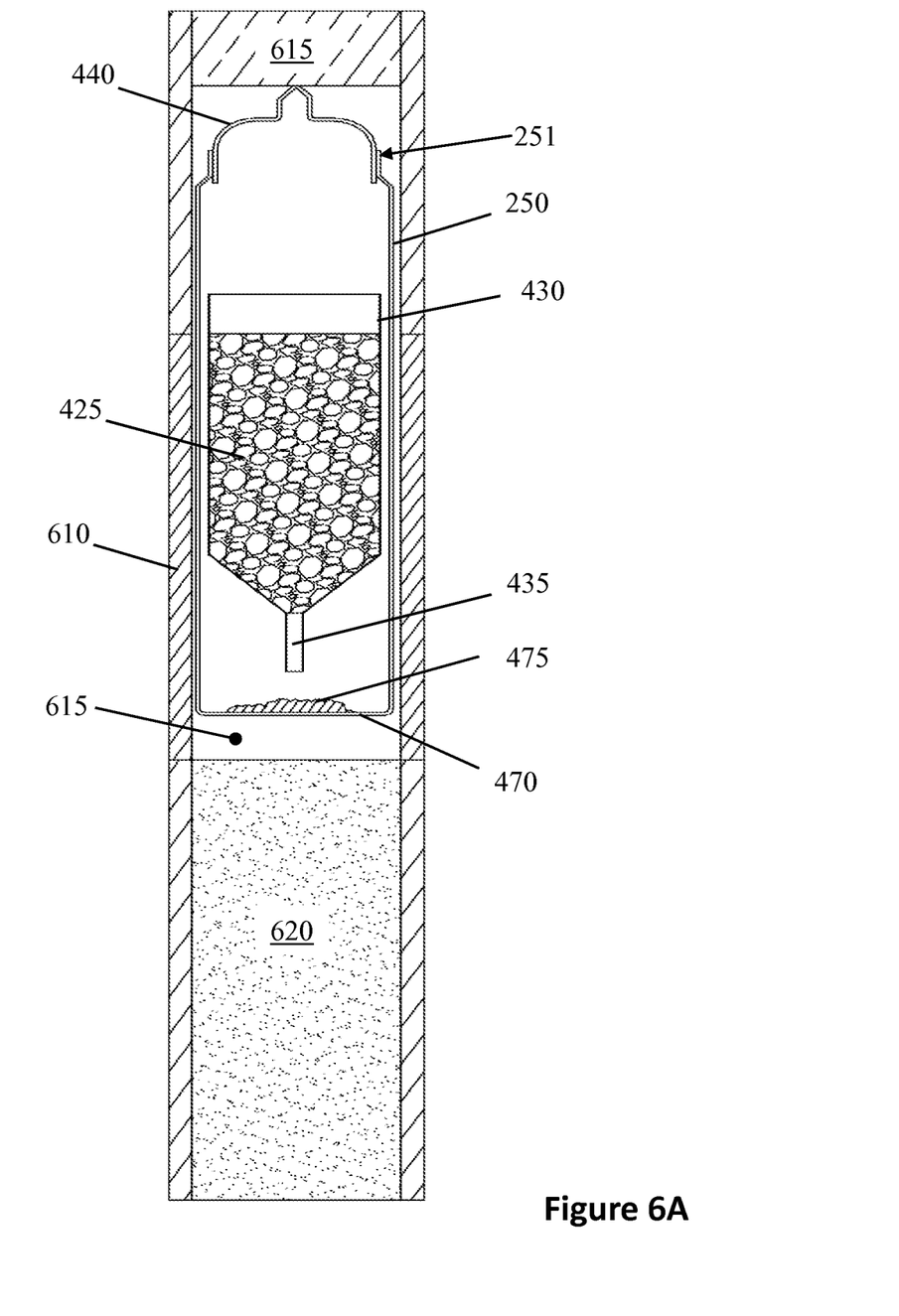
FIGS. 6A-6C are cross-sectional views of a crystal growth apparatus for growing high-resistance single crystals using the raw material prepared by the material-preparation apparatus.

Referring to FIG. 6A, the crystal growth apparatus 220 can include a lower heater 620 and a cylindrical shaped furnace 610 that defines a cavity 615 in the center. The vacuum sealable ampoule 250 containing the crucible 430 holding the purified raw material 425 is placed in the cavity 615 through an opening on the top of the furnace 610 (step 370, FIG. 3). The furnace 610 is then covered by an upper heater 615, as shown in FIG. 6A.

Figure 6B:
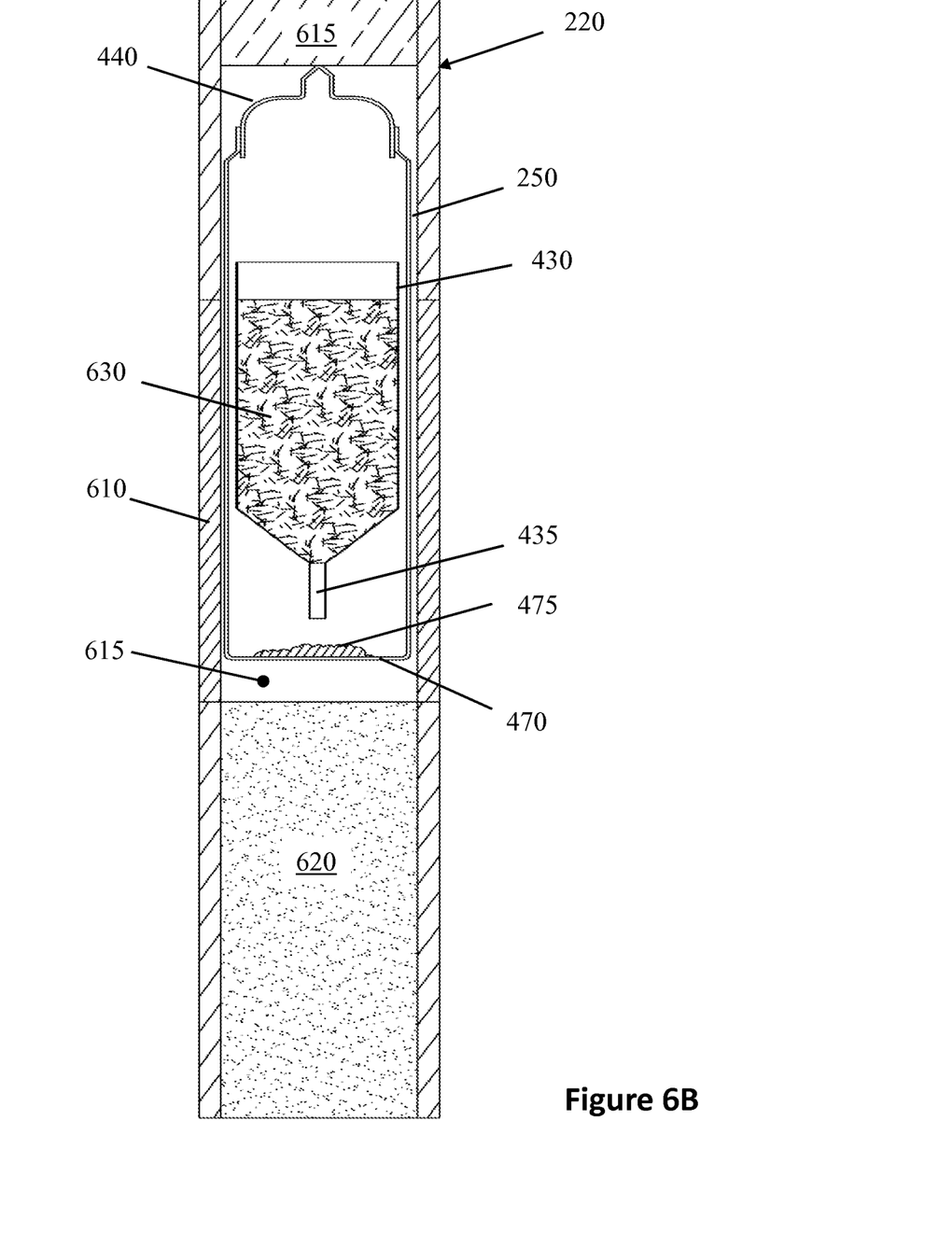
Figure 6C:
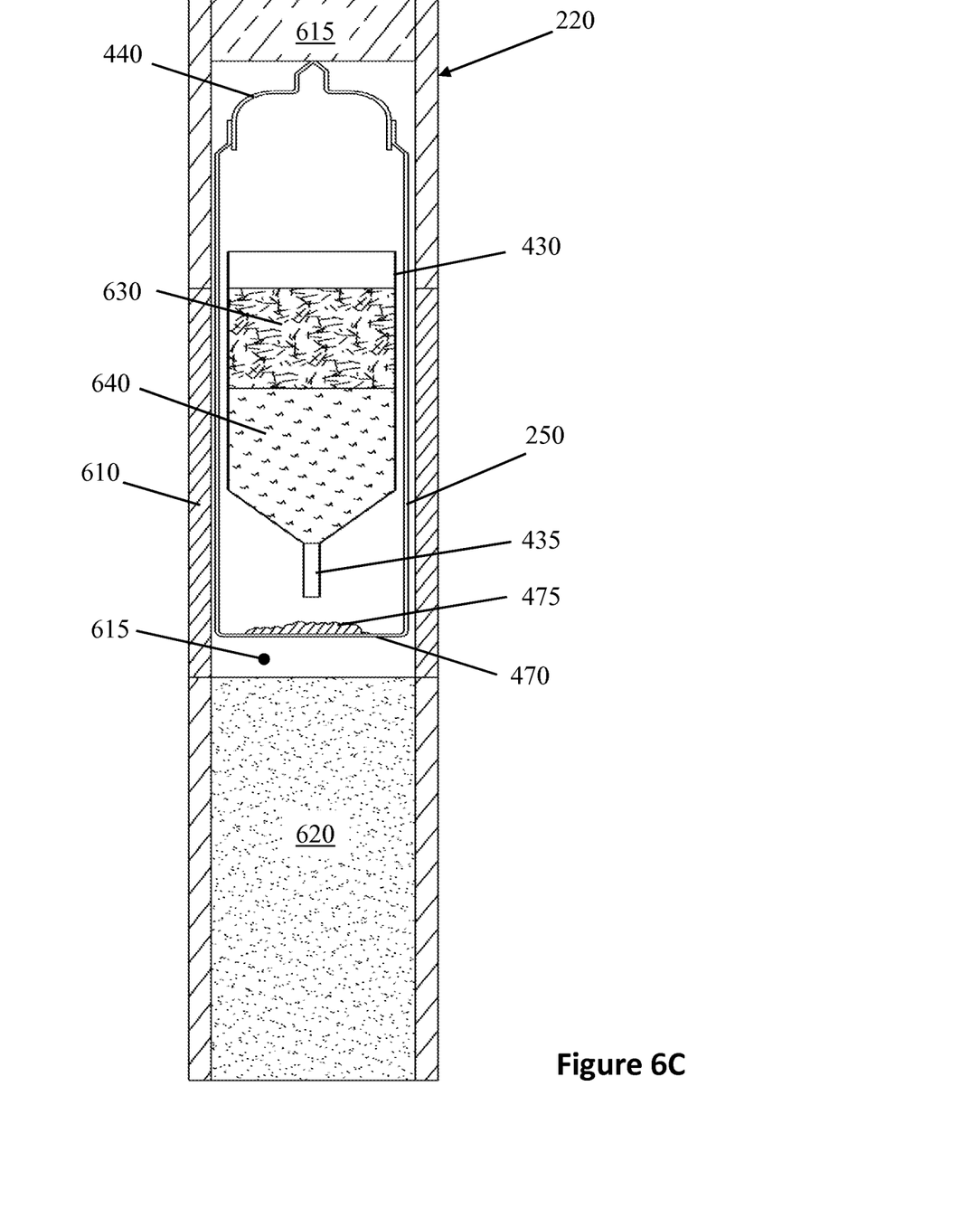

The furnace 610 is then heated to about 1238° C. (within 20° C. of 1238° C.) to melt the raw material 425 to form a melted material 630 in the crucible 250, as shown in FIG. 6B (step 375, FIG. 3). The seed crystal 435 provides the initial crystal surface from which a single crystal 640 can grow vertically out of the melted material 630 (step 375, FIG. 3), as shown in FIG. 6C.

Due to the selective impurity removals in the raw materials, the single crystal 640 can have certain un-removed impurities such as carbon, which results in electrical resistivity higher than $10^7$ Ω-cm at room temperature. In some embodiments, the resulting electrical resistivity is higher than $10^8$ Ω-cm at room temperature.

Details about a crystal growth apparatus is also disclosed in the commonly assigned U.S. patent application Ser. No. 12/908,157, filed Oct. 20, 2010 by the same inventor, the content of which is incorporated herein by reference.

It is understood the presently disclosed crystal growth system and methods are compatible with other variations without deviating from the spirit of the present invention. For example, other methods of crystal growth can be used in conjunction with the disclosed material preparation apparatus. The crystals can be grown from melted material vertically, as described above, or horizontally. For example, the crucible in the crystal growth apparatus can have the shape of a horizontal boat and the seed crystal is positioned at one side of the crucible. Additionally, crystal growth materials are not limited to the examples given above. Suitable materials can include other semiconductor materials and AlAs, GaN, CdTe, InAs, GaSb, Si, Ge, and other Group III-V, Group II-VI, Group IV materials.

What is claimed is:

1. A method of growing high-resistivity single crystals, comprising:
   placing a raw material in a vacuum-sealable ampoule, wherein the raw material comprises polycrystalline Group III-V material, Group II-VI material, or Group IV material, wherein the raw material comprises moisture and impurities that include oxide compounds and carbon;
   capping an open end of the vacuum-sealable ampoule while leaving an air channel between the cap and the rim of the open end of the vacuum-sealable ampoule, wherein the cap includes a bulb connected to the opening of the cap with a neck;

heating the raw material in the vacuum-sealable ampoule to vaporize the moisture in the raw material;

exhausting the vaporized moisture from the vacuum-sealable ampoule;

fusing the cap to the rim of the open end of the vacuum-sealable ampoule to vacuum seal the vacuum-sealable ampoule;

heating the raw material in the vacuum-sealable ampoule to vaporize the oxide compounds in the raw material;

cooling at least a portion of the bulb to produce condensed oxide compounds on an inner surface of the bulb;

fusing the neck of the bulb to isolate the condensed oxide compounds from the vacuum-sealable ampoule;

breaking the neck to remove the bulb and the condensed oxide compounds from the vacuum-sealable ampoule; and placing the vacuum-sealable ampoule comprising the raw material in a crystal growth apparatus to grow a high-resistivity crystal from the raw material.

2. The method of claim 1, wherein the raw material is placed in a crucible positioned in the vacuum-sealable ampoule.

3. The method of claim 1, wherein the vacuum-sealable ampoule is formed by quartz or glass.

4. The method of claim 1, wherein the impurities comprise at least one of silicon, carbon, or germanium.

5. The method of claim 1, wherein the high-resistivity crystal has an electric resistivity above $10^7$ Ω-cm at room temperature.

6. The method of claim 1, wherein the impurities include arsenide or arsenic compounds, the method comprising:

after the step of fusing the cap to the rim of the open end of the vacuum-sealable ampoule, heating the raw material in the vacuum-sealable ampoule to vaporize the arsenide and arsenic compounds in the raw material; and cooling a portion of the vacuum-sealable ampoule to produce condensed arsenide and arsenic compounds on an inner surface of the portion of the vacuum-sealable ampoule to remove the arsenide and arsenic from the raw material.

7. The method of claim 6, wherein the arsenide or arsenic compounds in the impurities are selected from the group consisting of AlAs, InAs, YAs, $B_{12}As_2$, $Ca_3As_2$, and $Zn_3As_2$.

8. The crystal growth apparatus of claim 1, wherein the polycrystalline material comprises GaAs, AlAs, GaN, CdTe, InAs, GaSb, Si, or Ge.

9. The method of claim 1, wherein a seed crystal is placed in contact with the raw material in the vacuum-sealable ampoule, the method further comprising:

heating the raw material to form a melt in contact with a seed crystal in the crystal growth apparatus, wherein the raw material comprises carbon as an impurity; and growing the high-resistivity crystal from the melt.

10. A method of growing high-resistivity single crystals, comprising:

placing a raw material in a vacuum-sealable ampoule, wherein the raw material comprises polycrystalline Group III-V material, Group II-VI material, or Group IV material, wherein the raw material comprises moisture and impurities that include oxide compounds and carbon;

heating the raw material in the vacuum-sealable ampoule to a first temperature to vaporize the moisture in the raw material;

removing the vaporized moisture from the vacuum-sealable ampoule;

heating the raw material in the vacuum-sealable ampoule to a second temperature to vaporize the oxide compounds in the raw material, wherein the second temperature is higher than the first temperature;

removing condensed oxide compounds from the vacuum-sealable ampoule; and heating the raw material to form a melt, wherein the raw material comprises carbon as an impurity; and growing a high-resistivity crystal from the melt, wherein the high-resistivity crystal has an electric resistivity above $10^7$ Ω-cm at room temperature.

11. The method of claim 10, wherein the first temperature is above 100° C., and wherein the second temperature is above 120° C.

12. The method of claim 10, wherein the steps of heating the raw material to form a melt and growing a high-resistivity crystal from the melt are performed in a crystal growth apparatus.

13. A method of growing high-resistivity single crystals, comprising:

placing a raw material in a vacuum-sealable ampoule through an open end of the vacuum-sealable ampoule, wherein the raw material comprises polycrystalline GaAs, moisture, and impurities, wherein the impurities comprise arsenide or arsenic compounds and carbon;

heating the raw material in the vacuum-sealable ampoule to vaporize the moisture in the raw material, wherein the impurities comprise oxide compounds, wherein the step of heating the raw material in the vacuum-sealable ampoule to vaporize the arsenide and arsenic compounds in the raw material vaporizes the oxide compounds in the raw material;

exhausting the vaporized moisture from the vacuum-sealable ampoule;

sealing the vacuum-sealable ampoule;

heating the raw material in the vacuum-sealable ampoule to vaporize the arsenide and arsenic compounds in the raw material;

cooling a portion of the vacuum-sealable ampoule to produce condensed arsenide and arsenic compounds on an inner surface of the portion of the vacuum-sealable ampoule;

after the step of cooling a portion of the vacuum-sealable ampoule, lowering the temperature of the raw material in the vacuum-sealable ampoule to below the vaporization temperature of the arsenide and arsenic compounds but above the vaporization temperature of the oxide compounds:

cooling a surface in connection with the vacuum-sealable ampoule to produce condensed oxide compounds on the surface;

removing the condensed oxide compounds from the vacuum-sealable ampoule; and placing the vacuum-sealable ampoule comprising the raw material in a crystal growth apparatus to grow a high-resistivity GaAs crystal, wherein the raw material comprises carbon as an impurity.

14. The method of claim 13, wherein the raw material is placed in a crucible positioned in the vacuum-sealable ampoule, wherein the condensed arsenide or arsenic compounds are formed outside of the crucible, wherein the high-resistivity crystal is grown in the crucible.

15. The method of claim 13, wherein the vacuum-sealable ampoule is formed by quartz or glass.

16. The method of claim 13, further comprising:
capping the open end of the vacuum-sealable ampoule after the step of exhausting the vaporized moisture, wherein the step of sealing comprises fusing the cap to the rim of the open end of the vacuum-sealable ampoule to vacuum seal the vacuum-sealable ampoule.

17. The method of claim 16, wherein the impurities comprise oxide compounds, wherein the step of heating the raw material in the vacuum-sealable ampoule to vaporize the arsenide and arsenic compounds in the raw material vaporizes the oxide compounds in the raw material, wherein the cap includes a bulb connected to the opening of the cap with a neck, the method further comprising:
- after the step of sealing the vacuum-sealable amp, lowering the temperature of the raw material in the vacuum-sealable ampoule to below the vaporization temperature of the arsenide and arsenic compounds but above the vaporization temperature of the oxide compounds;
- cooling at least a portion of the bulb in the cap to below the vaporization temperature of the oxide compounds to produce condensed oxide compounds on an inner surface of the bulb;
- fusing the neck of bulb to isolate the condensed oxide compounds from the vacuum-sealable ampoule; and
- breaking the neck of the bulb to separate the bulb and the condensed oxide compounds from the vacuum-sealable ampoule.

18. The method of claim 13, wherein the high-resistivity GaAS crystal has an electric resistivity above $10^8$ $\Omega$-cm at room temperature.

19. The method of claim 13, further comprising:
heating the raw material to form a melt in the crystal growth apparatus, wherein the raw material comprises carbon as an impurity; and
growing the high-resistivity GaAs crystal from the melt.

* * * * *